United States Patent
Chiang et al.

(10) Patent No.: US 10,163,812 B2
(45) Date of Patent: Dec. 25, 2018

(54) DEVICE HAVING SUBSTRATE WITH CONDUCTIVE PILLARS

(71) Applicant: Infineon Technologies AG, Neubiberg (DE)

(72) Inventors: Chau Fatt Chiang, Melaka (MY); Kok Yau Chua, Melaka (MY); Swee Kah Lee, Melaka (MY); Chee Yang Ng, Johor (MY); Valentyn Solomko, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/297,744

(22) Filed: Oct. 19, 2016

(65) Prior Publication Data

US 2018/0108616 A1   Apr. 19, 2018

(51) Int. Cl.

| H01L 23/498 | (2006.01) |
|---|---|
| H01L 23/552 | (2006.01) |
| H01L 21/48 | (2006.01) |
| H01L 21/56 | (2006.01) |
| H01L 23/31 | (2006.01) |
| H01L 23/367 | (2006.01) |
| H01L 23/66 | (2006.01) |
| H01L 23/00 | (2006.01) |

(52) U.S. Cl.
CPC .......... *H01L 23/552* (2013.01); *H01L 21/485* (2013.01); *H01L 21/4853* (2013.01); *H01L 21/4882* (2013.01); *H01L 21/565* (2013.01); *H01L 23/3114* (2013.01); *H01L 23/367* (2013.01); *H01L 23/49838* (2013.01); *H01L 23/66* (2013.01); *H01L 24/48* (2013.01); *H01L 2223/6677* (2013.01); *H01L 2224/48227* (2013.01); *H01L 2924/3025* (2013.01)

(58) Field of Classification Search
CPC ............ H01L 23/498; H01L 23/49805; H01L 23/49811; H01L 23/49827; H01L 23/49861; H01L 23/50
See application file for complete search history.

(56) References Cited

U.S. PATENT DOCUMENTS

| 7,432,591 B1 | 10/2008 | Yamada et al. |
|---|---|---|
| 8,169,058 B2 | 5/2012 | Pagaila et al. |
| 8,916,965 B2 | 12/2014 | Williams |
| 9,123,663 B2 | 9/2015 | Kim et al. |
| 9,653,391 B1 * | 5/2017 | Yew .................. H01L 23/49816 |
| 2013/0146872 A1 | 6/2013 | Chen et al. |
| 2014/0126159 A1 | 5/2014 | Lin et al. |
| 2016/0190059 A1 * | 6/2016 | Tseng ................... H01L 23/528 257/774 |
| 2017/0053898 A1 * | 2/2017 | Yeh .................... H01L 25/0657 |
| 2017/0263546 A1 * | 9/2017 | Lin ................... H01L 23/49838 |

* cited by examiner

*Primary Examiner* — Andrew Q Tran
(74) *Attorney, Agent, or Firm* — Dicke, Billig & Czaja, PLLC (57) ABSTRACT

A device includes a substrate that includes conductive structures and has a first surface that is opposite to a second surface. Conductive pillars are built up over and electrically coupled to at least one of the conductive structures. An integrated circuit is disposed over the first surface and electrically coupled to the conductive structures. A molding compound is formed over the first surface of the substrate.

8 Claims, 9 Drawing Sheets

DEVICE HAVING SUBSTRATE WITH CONDUCTIVE PILLARS

FIELD OF TECHNOLOGY

The present application relates to an interconnect substrate, in particular, an interconnect substrate that includes conductive pillars.

BACKGROUND

The increasing demand for electronic devices for application areas such as automotive, smartphones and the Internet of Things (IoT) has resulted in an increased demand for high performance and high reliability integrated circuits. Electronic devices for these application areas are continually moving towards higher functionality and miniaturization of size. As a result, demand is increasing for integrated circuit packaging approaches that are smaller, more compact and more reliable.

One approach that has been developed is Molded Interconnect Substrate (MIS). MIS is a substrate solution that utilizes embedded copper trace technology to meet the demands for high I/O counts and a smaller size or form factor. MIS uses materials that are more compatible with the thermal-mechanical properties of integrated circuit materials such as silicon. For a typical packaging application that uses MIS, an integrated circuit die is attached to a substrate using a wire bond or flip-chip process. The top of the substrate is covered with a molding compound and external contacts for the integrated circuit are provided at a bottom of the substrate.

SUMMARY

According to an embodiment of a device, the device includes a substrate that includes conductive structures and has a first surface that is opposite to a second surface. Conductive pillars are built up over and electrically coupled to at least one of the conductive structures. An integrated circuit is disposed over the first surface and electrically coupled to the conductive structures. A molding compound is formed over the first surface of the substrate.

According to an embodiment of a package, the package includes a substrate that includes conductive layers and has a first surface that is opposite to a second surface. Conductive pillars are built up over and electrically coupled to at least one of the conductive layers. The conductive pillars are adjacent to one or more edges of the first surface of the substrate. Each one of the conductive pillars includes a portion proximate an exterior edge of the first surface.

According to an embodiment of a method of forming a device, the method includes providing a substrate that includes conductive structures and has a first surface that is opposite to a second surface. The method includes building up conductive pillars over at least one of the conductive structures. The conductive pillars are electrically coupled to the at least one of the conductive structures. The method includes attaching an integrated circuit to the first surface. The integrated circuit is electrically coupled to the conductive structures. The method includes forming a molding compound over the first surface of the substrate.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1A:
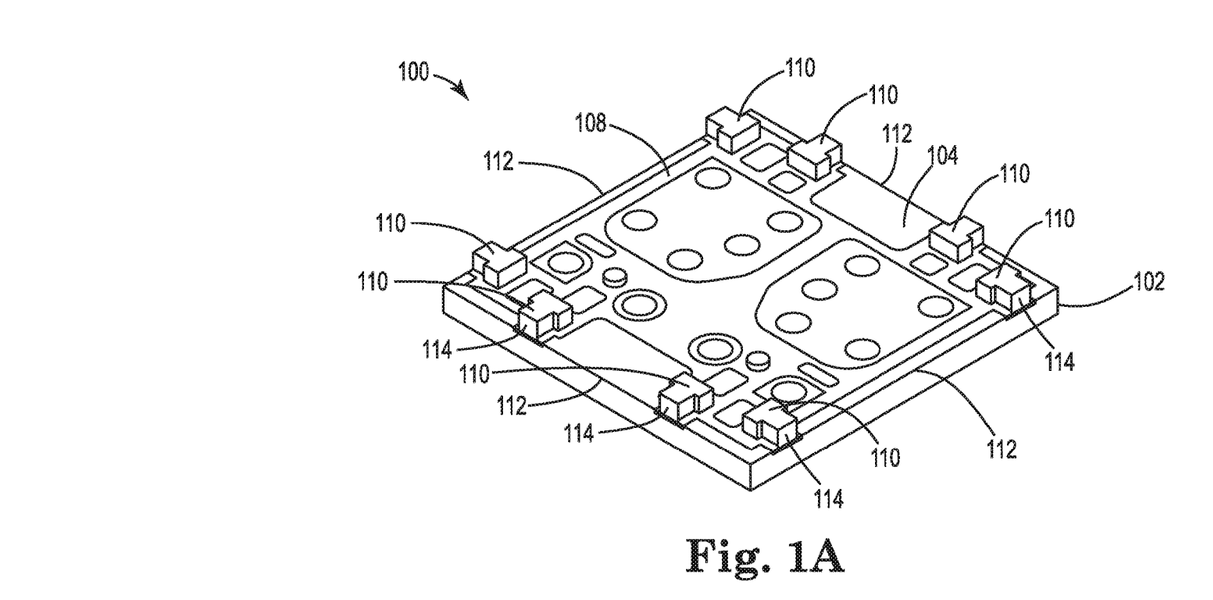
FIGS. 1A-1B illustrate perspective and side views of an embodiment of a device.
Figure 1B:
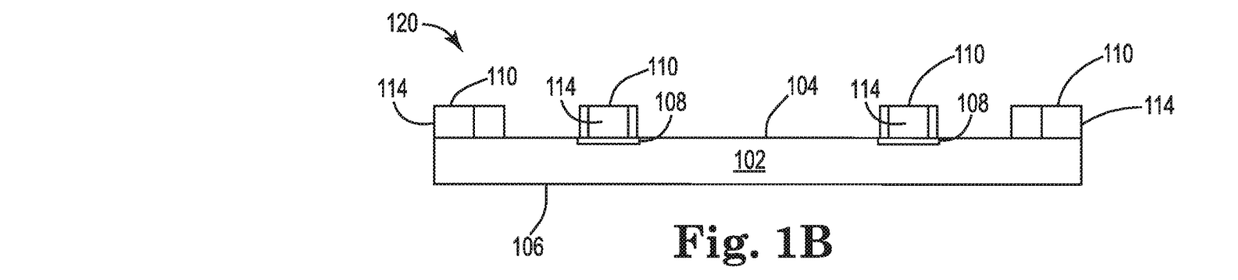

FIGS. 1A-1B illustrate perspective and side views of an embodiment of a device. FIG. 1A illustrates a perspective view of a package at 100. Package 100 includes a substrate 102. Substrate 102 includes conductive structures or layers 108 and has a first surface 104 that is opposite to a second surface 106. Substrate 102 includes conductive pillars 110 that are built up over and electrically coupled to at least one of conductive structures 108. In various embodiments, suitable processes such as an electrolytic plating process or an electroless plating process can be used to build up conductive pillars 110. In the illustrated embodiment, conductive pillars 110 are adjacent to one or more edges 112 of first surface 104 of substrate 102. Each one of the conductive pillars 110 includes a portion 114 proximate an exterior edge 112 of first surface 104.

FIG. 1B illustrates a side view of a package at 120. Conductive structures 110 are formed over conductive structures 108. In the illustrated embodiment, conductive structures 110 are built up over and electrically coupled to conductive structures 108. In other embodiments, conductive pillars 110 are electrically coupled to conductive structures or layers 108 that are inside or within surface 104 of substrate 102.

Figure 2A:
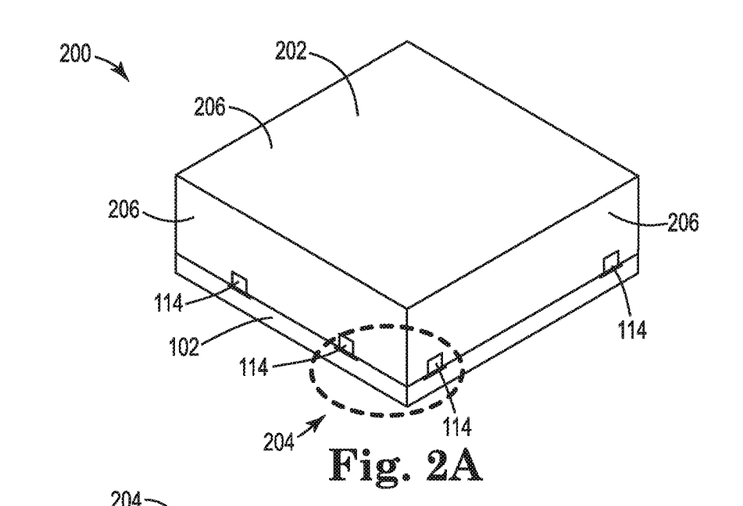
FIGS. 2A-2B illustrate perspective and detail views of an embodiment of a device.
Figure 2B:
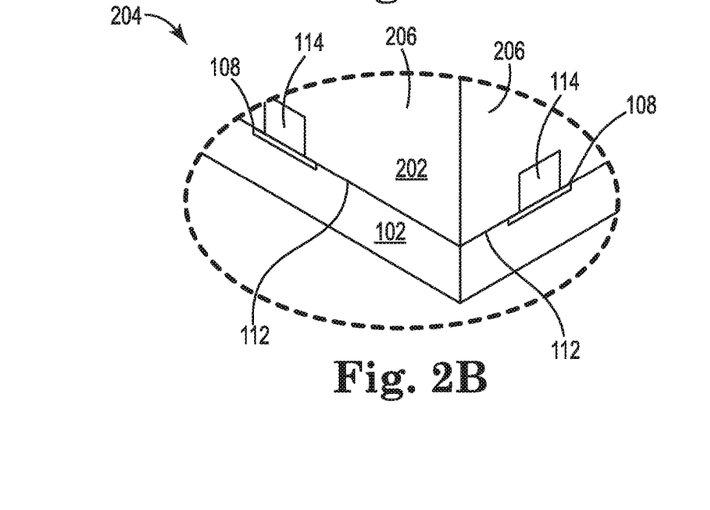

FIGS. 2A-2B illustrate perspective and detail views of an embodiment of a device at 200. FIG. 2A illustrates a molding compound 202 that is formed over first surface 104 of substrate 102. The illustrated embodiment, molding compound 202 is formed over package 100. Although not illustrated, in some embodiments device 200 includes an integrated circuit disposed over first surface 104 that is electrically coupled to one or more of the conductive structures 108. In the illustrated embodiment, conductive pillars 110 are adjacent to one or more edges 112 of first surface 104 of substrate 102. Portion 114 of each one of the one or more conductive pillars 110 is exposed at a side exterior surface 206 of molding compound 202.

FIG. 2B illustrates a detailed view of the portion in FIG. 2A that is illustrated at 204. Portions 114 of conductive pillars 110 are exposed through surface 206 of molding compound 202. Although portions 114 are shown as being adjacent to edges 112, in other embodiments, portions 114 can be interior to edges 112 or can extend over or beyond edges 112 and protrude through surface 206 of molding compound 202.

Figure 3A:
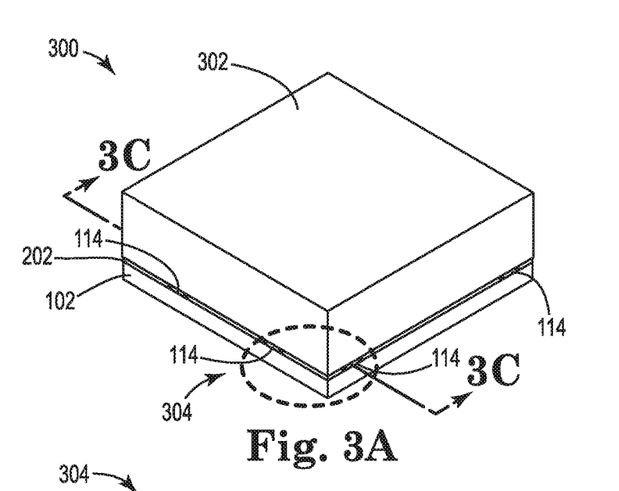
FIGS. 3A-3C illustrate perspective, detail and cross-sectional views of an embodiment of a device.
Figure 3B:
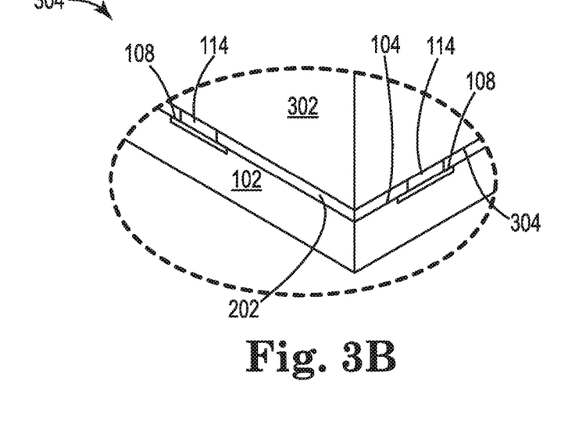
Figure 3C:
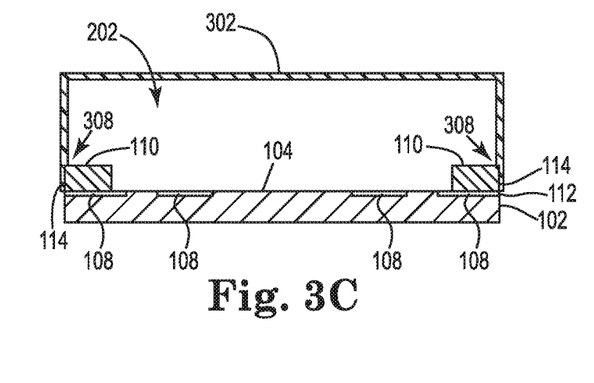

FIGS. 3A-3C illustrate perspective and cross-sectional views of an embodiment of a device at 300. FIG. 3A illustrates a device 300 that includes a metal plating at 302 formed over at least a portion of exterior surface 206 of molding compound 202 (See also, FIG. 2A). FIG. 3B is a detailed view of the portion in FIG. 3A that is illustrated at 304. FIG. 3C is a cross-sectional view of device 300 as illustrated in FIG. 3A. Metal plating 302 is in conductive contact with portions 114 of one or more of the conductive pillars 110. In the illustrated embodiment, metal plating 302 overlaps portions 114 as illustrated at 308. In one embodiment, metal plating 308 is formed over portions 114 and is proximate to one or more edges 112 of first surface 104 of substrate 102.

In the illustrated embodiment, metal plating 302 is an electromagnetic interference shield that is in conductive contact with conductive pillars 110 that are at a ground potential. In other embodiments, Metal plating 302 forms an antenna structure and can have any suitable shape, dimensions or coverage over exterior surface 206 of molding compound 202. In various embodiments, metal plating 302 can be coupled to conductive pillars 110 where the conductive pillars 110 are coupled to a supply voltage, a ground potential, to one or more input/output pins of an integrated circuit, or to any combination of these. In one embodiment, metal plating 302 is an antenna and is coupled to one or more conductive pillars that are at a ground potential and to one or more conductive pillars that are coupled to input/output pins of an integrated circuit.

Figure 4A:
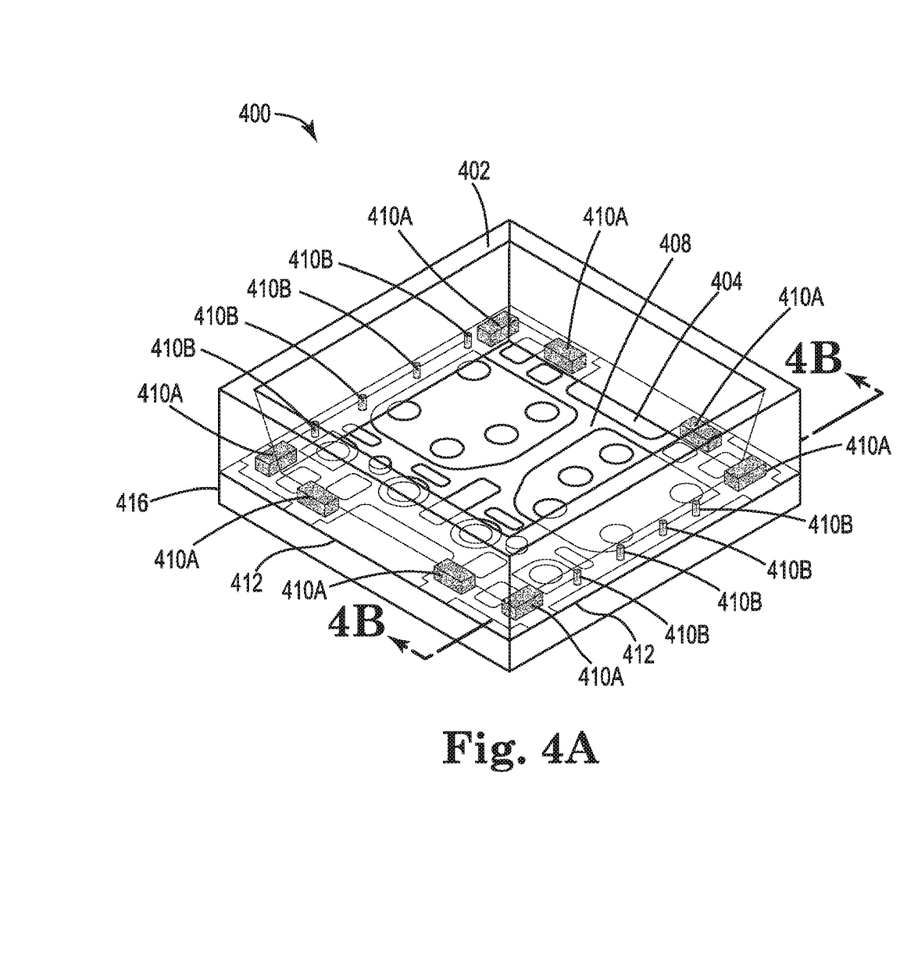
FIGS. 4A-4B illustrate perspective and cross-sectional views of an embodiment of a device.
Figure 4B:
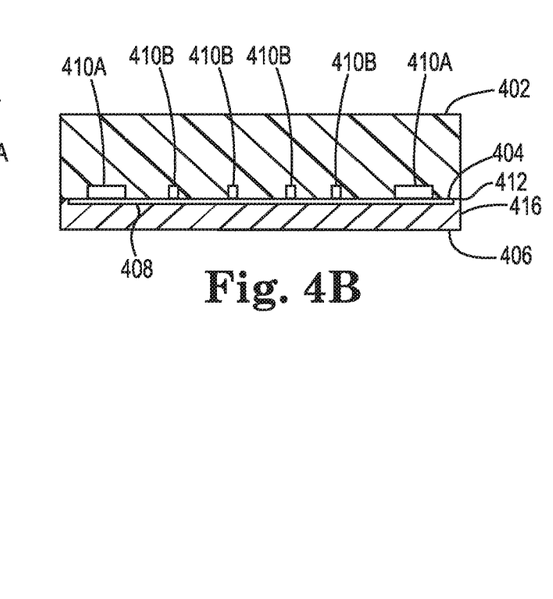

FIGS. 4A-4B illustrate perspective and cross-sectional views of an embodiment of a device at 400. Referring to FIG. 4A and FIG. 4B, device 400 includes conductive pillars 410A and 410B that are built up over and in conductive contact with one or more conductive structures or layers 408 in substrate 416. Substrate 416 includes a first surface at 404 and a second surface at 406. In the illustrated embodiment, conductive pillars 410A and 410B are adjacent to edges 412 of surface 404. In various embodiments, suitable processes such as an electrolytic plating process or an electroless plating process can be used to build up conductive pillars 410A and 410B.

In the illustrated embodiment, device 400 includes an overmold 402 that is formed over conductive pillars 410A and 410B. Conductive pillars 410A and 410B form an interlocking relationship between molding compound 402 and substrate 416. In various embodiments, the interlocking relationship provides a secure attachment of molding compound 402 to surface 404 of substrate 416. In the illustrated embodiment, conductive pillars 410 are illustrated as having relative shapes and dimensions as illustrated at 410A and 410B. In other embodiments, conductive pillars 410 can have the same size or can have other suitable shapes and dimensions.

Figures 5A, 5B, 5C, 5D, 5E:
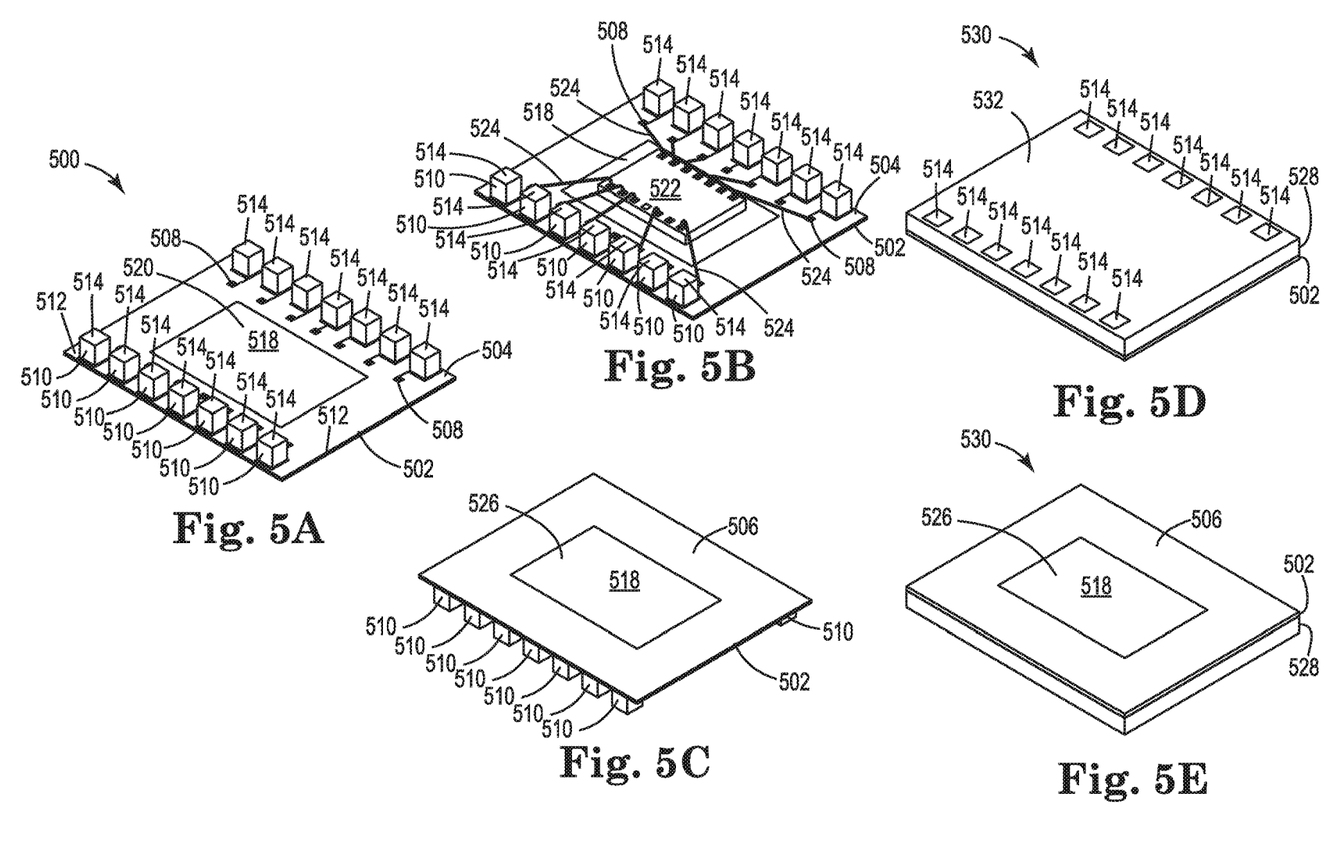
FIGS. 5A-5E illustrate perspective views of an embodiment of a device.

FIGS. 5A-5E illustrate perspective views of an embodiment of a device. FIG. 5A illustrates an embodiment of a package 500 that includes a substrate 502. Substrate 502 includes conductive structures or layers 508 and has a first surface 504 that is opposite to a second surface 506. Substrate 502 includes conductive pillars 510 that are built up over and electrically coupled to at least one of conductive structures 508. In various embodiments, suitable processes such as an electrolytic plating process or an electroless plating process can be used to build up conductive pillars 510. In the illustrated embodiment, conductive pillars 510 are adjacent to one or more edges 512 of first surface 504 of substrate 502. Each one of the conductive pillars 510 includes a top surface 514.

Referring to FIG. 5A and FIG. 5C, the conductive structures 508 include a conductive structure 518 that is embedded within substrate 502. Conductive structure 518 includes a first surface 520 that is exposed at and substantially parallel to first surface 504 of substrate 502. Conductive structure 518 also includes a second surface 526 that is exposed at and substantially parallel to second surface 506 of substrate 502. In the illustrated embodiment, conductive structure 518 is a heat sink.

FIG. 5B and FIG. 5C illustrate, respectively, top and bottom views of package 500 during a semiconductor back-end assembly process. During this process, integrated circuit 522 is attached to conductive structure 518 and conductive structure 518 provides a thermally conductive contact between integrated circuit 522 and second side 506 of substrate 502. In other embodiments, conductive structure 518 provides both a thermally and electrically conductive contact between integrated circuit 522 and second side 506 of substrate 502. In the illustrated embodiment, integrated circuit 522 is attached to first surface 520 of conductive structure 522 and is electrically coupled to one or more of the conductive layers 108 via wire bonds 524. Conductive pillars 510 are attached to and in conductive contact with conductive layers 508. In the illustrated embodiment, one or more of the conductive layers 508 electrically couple integrated circuit 522 to one or more of the conductive pillars 510. In the illustrated embodiment, conductive pillars 510 provide supply voltage, ground and input/output connections for integrated circuit 522.

FIG. 5D and FIG. 5E illustrate, respectively, top and bottom views of a device 530. Device 530 corresponds to package 500 after a molding compound 528 has been formed over first surface 504 of substrate 502. A top surface 514 of each one of the conductive pillars 510 is exposed at a top exterior surface 532 of molding compound 528. In the illustrated embodiment, top surfaces 514 serve as bond pads at top surface 532 to provide the ability to electrically connect device 530 to external supply voltage, ground and input/output connections. In the illustrated embodiment, conductive structure 518 serves as a heat sink and surface 526 of conductive structure 518 provides a thermally conductive contact at second side 506 of substrate 502. In the illustrated embodiment, top surfaces 514 at top surface 532 of device 530 and second side 526 of conductive structure 518 are on opposing sides of device 530.

Figure 6A:
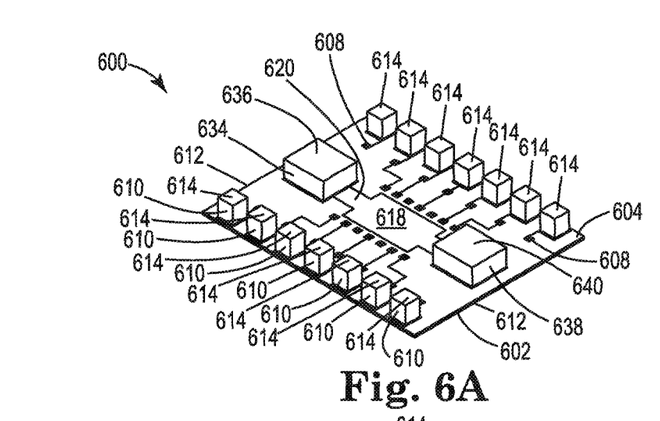
FIGS. 6A-6D illustrate perspective views of an embodiment of a device.

FIGS. 6A-6D illustrate perspective views of an embodiment of a device. FIG. 6A illustrates an embodiment of a package 600 that includes a substrate 602. Substrate 602 includes conductive structures or layers 608 and has a first surface 604 that is opposite to a second surface 606. Substrate 602 includes conductive pillars 610 that are built up over and electrically coupled to at least one of conductive structures 608. In various embodiments, suitable processes such as an electrolytic plating process or an electroless plating process can be used to build up conductive pillars 610. In the illustrated embodiment, conductive pillars 610 are adjacent to one or more edges 612 of first surface 604 of substrate 602. Each one of the conductive pillars 610 includes a top surface 614.

Figure 6B:
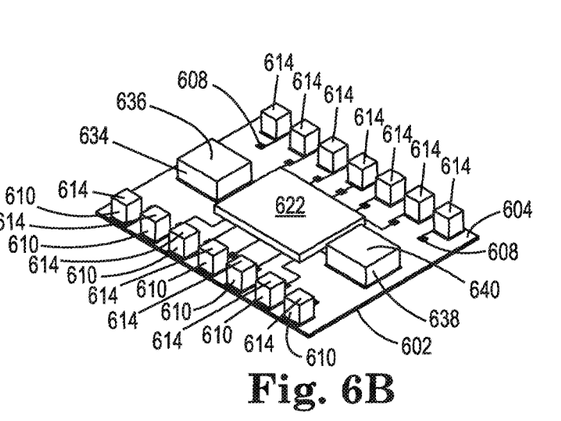
Figure 6C:
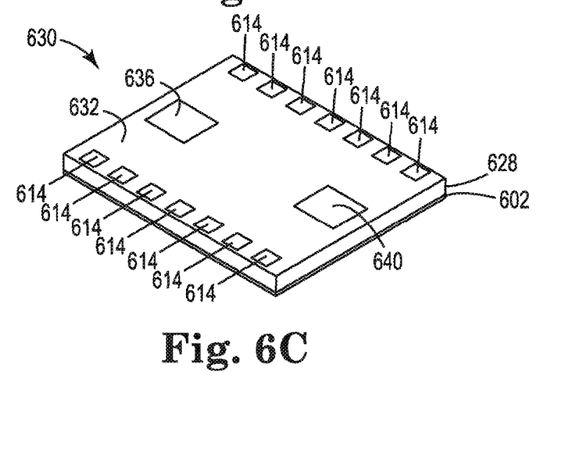
Figure 6D:
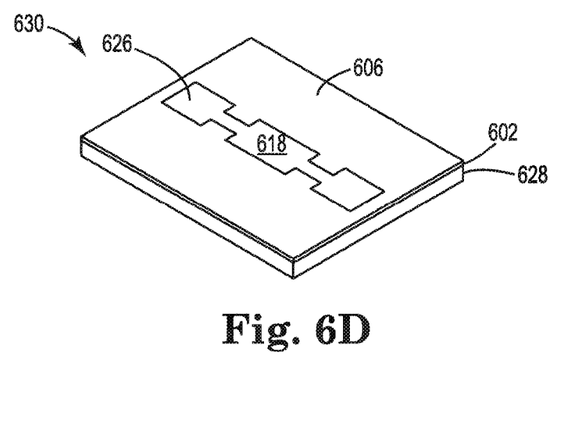

Referring to FIG. 6A and FIG. 6D, conductive structures 608 include a conductive structure 618 that is embedded in substrate 602. Conductive structure 618 includes a first surface 620 that is exposed at and substantially parallel to first surface 604 of substrate 602. Conductive structure 618 also includes a second surface 626 that is exposed at and substantially parallel to second surface 606 of substrate 602. In the illustrated embodiment, conductive structure 618 is a heat sink. Conductive pillars 634 and 638 are built up over and electrically coupled to a first surface 620 of conductive structure 618. Conductive pillar 634 includes a top surface 636 and conductive pillar 638 includes a top surface 640.

In other embodiments, conductive structure 618 can include two or more separate conductive structures 618. In one exemplary embodiment, conductive structure 618 includes three conductive structures 618 and conductive pillar 634 is built up over and electrically coupled to a first one of the three conductive structures 618 and conductive pillar 638 is built up over and electrically coupled to a second one of the three conductive structures 618.

FIG. 6B illustrates a view of package 600 during a semiconductor back-end assembly process. During this process, integrated circuit 622 is attached to conductive structures 608 and conductive structure 618 using a flip-chip assembly process. In one embodiment, integrated circuit 622 includes one or more bond pads that are attached to conductive structure 618, where conductive structure 618 provides a thermally and electrically conductive contact between integrated circuit 622 and second side 606 of substrate 602. In the illustrated embodiment, integrated circuit 622 is electrically connected to one or more of the conductive layers 608 via the flip-chip process. Conductive pillars 610 are built up over and electrically coupled to conductive layers 608. One or more of the conductive layers 608 electrically couple integrated circuit 622 to one or more of the conductive pillars 610. In the illustrated embodiment, conductive pillars 610 provide supply voltage, ground and input/output connections for integrated circuit 622.

FIG. 6C and FIG. 6D illustrate, respectively, top and bottom views of a device 630. Device 630 corresponds to package 600 after a molding compound 628 has been formed over first surface 604 of substrate 602. A top surface 614 of each one of the conductive pillars 610 is exposed at a top exterior surface 632 of molding compound 628. A top surface 636 of conductive pillar 634 and a top surface 640 of conductive pillar 638 are also exposed at top exterior surface 632 of molding compound 628. A second surface 626 of conductive structure 618 is exposed at second surface 606 of substrate 602

Figure 7A:
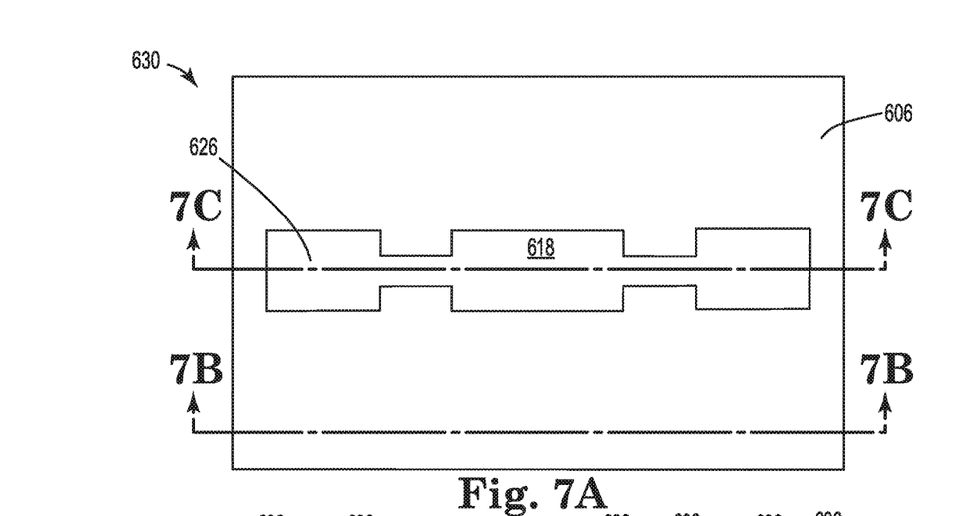
FIGS. 7A-7C illustrate cross-sectional views of the device illustrated in FIG. 6D.
Figure 7B:
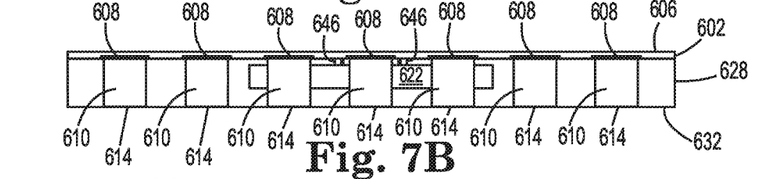
Figure 7C:
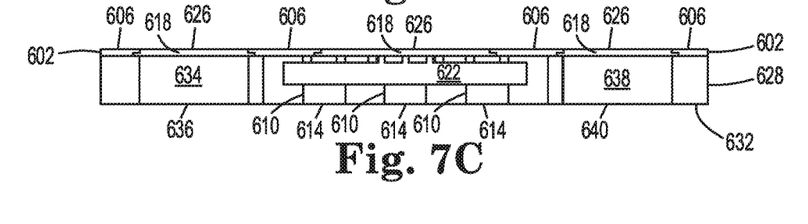

FIGS. 7A-7C illustrate cross-sectional views of the device 630 illustrated in FIG. 6D. Referring to FIG. 7A-7C, integrated circuit 622 includes one or more contacts 646. In the illustrated embodiment, contacts 646 are formed during a flip-chip assembly process. One or more contacts 646 are electrically connected to conductive layers 608 and one or more contacts 646 are electrically connected to surface 620 of conductive structure 618. In the illustrated embodiment, top surfaces 614 serve as bond pads at top surface 632 to electrically connect device 630 to external supply voltage, ground or input/output connections. In the illustrated embodiment, conductive structure 618 serves as a heat sink and surface 626 of conductive structure 618 provides a thermally and/or conductive contact at second side 606 of substrate 602. In the illustrated embodiment, conductive structures 634 and 638 also serve as heat sinks and top surfaces 636 and 640 of conductive structures 634 and 638 are exposed at top surface 632 of molding compound 628 and provide a thermally and/or conductive contact at surface 632.

In the illustrated embodiment, top surface 632 of molding compound 628 and second surface 606 of substrate 602 are on opposing sides of device 600. At top surface 632 (one of the two opposing sides), top surfaces 614 of conductive pillars 610 provide one or more of supply voltage, ground and input/output connections for integrated circuit 622 and top surfaces 636 and 640 of conductive structures 634 and 638 provide one or both of a thermally conductive and electrically conductive connection for integrated circuit 622. At second side 606 (the other one of the two opposing sides), surface 626 of conductive structure 618 provides a thermally conductive and/or an electrically conductive contact at second side 606 of substrate 602.

Figure 8A:
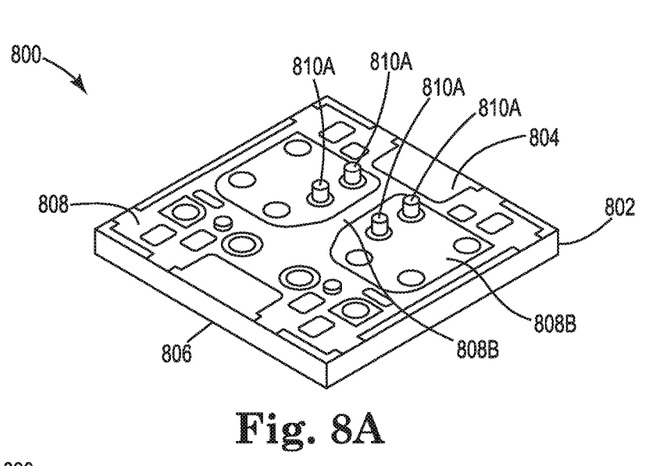
FIGS. 8A-8D illustrate perspective and side views of an embodiment of a device.

FIGS. 8A-8D illustrate perspective and side views of an embodiment of a device. FIG. 8A illustrates an embodiment of a package 800 that includes a substrate 802. Substrate 802 includes conductive structures or layers 808 and has a first surface 804 that is opposite to a second surface 806. Substrate 802 includes conductive pillars 810A that are built up over and electrically coupled to conductive structures 808. In various embodiments, suitable processes such as an electrolytic plating process or an electroless plating process can be used to build up conductive pillars 810A.

Figure 8B:
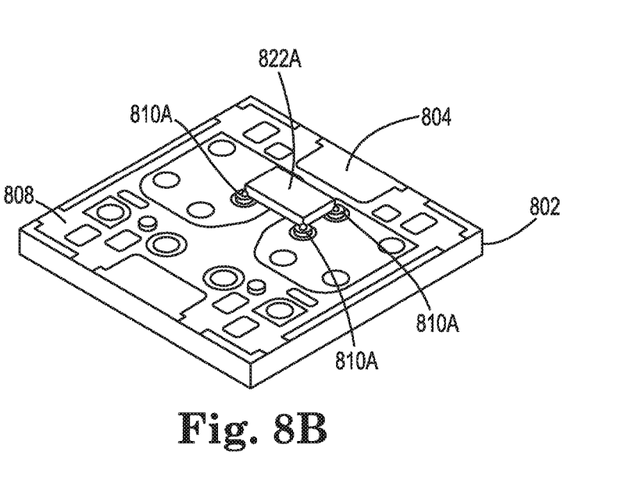
Figure 8C:
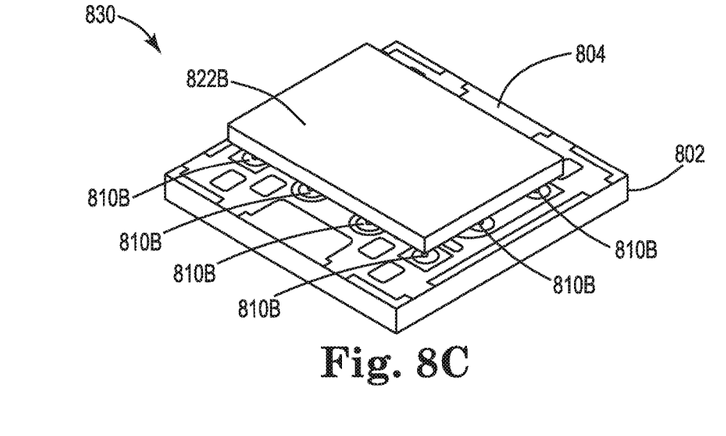

FIG. 8B illustrates an embodiment of a package 800 having an integrated circuit 822A mounted on and electrically coupled to conductive pillars 810A. FIG. 8C illustrates an embodiment where a second integrated circuit 822B is mounted over integrated circuit 822A using conductive pillars 810B. In one embodiment, conductive pillars 810B are attached to and electrically coupled to second integrated circuit 822B before second integrated circuit 822B is mounted over integrated circuit 822A. In one embodiment, conductive pillars 810B are attached to and electrically coupled to conductive structures 808 before second integrated circuit 822B is mounted over integrated circuit 822A.

Figure 8D:
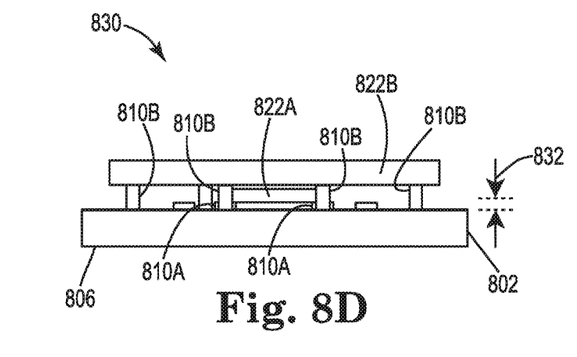

In the illustrated embodiment, integrated circuit 822B is mounted over integrated circuit 822A using eight conductive pillars 810B. In various embodiments, integrated circuit 822B can be mounted over integrated circuit 822A using three or more conductive pillars 810B. FIG. 8D illustrates a side view of the embodiment of device 830 as illustrated in FIG. 8C. Conductive pillars 810A have a height that is illustrated at 832. In the illustrated embodiment, height 832 has a suitable value that prevents integrated circuit 822A from electrically contacting or shorting to portions 808B of conductive structures 808 that are under integrated circuit 822A.

Figure 9:
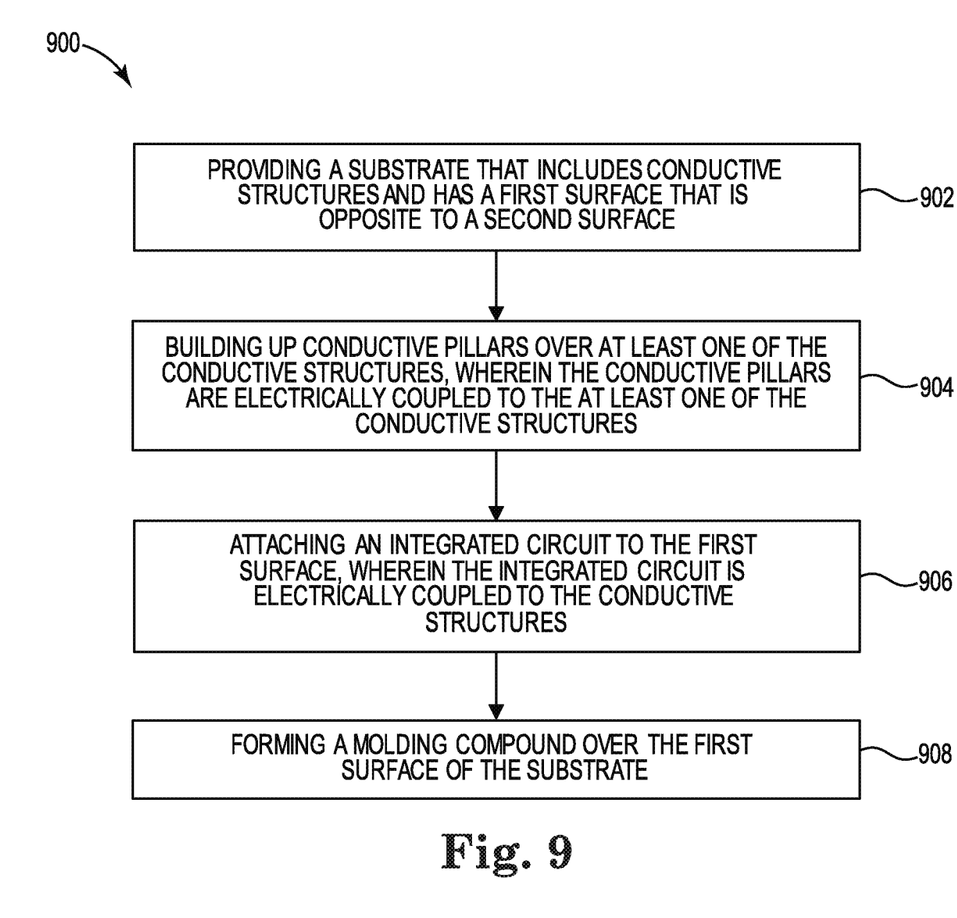
FIG. 9 illustrates a flowchart of an embodiment of a method of forming a device

FIG. 9 illustrates a flowchart of an embodiment of a method of forming a device. The method is illustrated at 900. At 902, a substrate 102 is provided. Substrate 102 includes conductive structures or layers 108 and has a first surface 104 that is opposite to a second surface 106. At 902, conductive pillars 110 are built up over and electrically coupled to at least one of the conductive structures 108. In one embodiment, building up conductive pillars 110 includes building up one or more of conductive pillars 410 to be adjacent to one or more edges 412 of first surface 404 of a substrate 416. The one or more conductive pillars 410 form an interlocking relationship between a molding compound 402 and substrate 416. At 906, an integrated circuit is attached to first surface 104, where the integrated circuit is electrically coupled to the conductive structures 110. In one embodiment, an integrated circuit 522 is attached to first surface 504, where the integrated circuit 522 is electrically coupled to the conductive structures 510. In one embodiment, an integrated circuit 622 is attached to first surface 604, where the integrated circuit 622 is electrically coupled to the conductive structures 610. At 908, a molding compound 202 is formed over first surface 104 of substrate 102. In one embodiment, forming molding compound 202 includes exposing a portion 114 of each one of the one or more conductive pillars 110 at an exterior surface 206 of molding compound 202. In some embodiments, forming molding compound 202 over first surface 104 of substrate 102 includes forming a metal plating 302 over at least a portion of exterior surface 206 of molding compound 202 such that metal plating 302 is in conductive contact with portions 114 of the one or more conductive pillars 110. In one embodiment, forming the metal plating 302 includes forming the metal plating 302 over the portions 114 of the one or more conductive pillars 110 and proximate to one or more edges 112 of the first surface 104 of the substrate 102. In one embodiment, forming a molding compound 202 includes forming a molding compound 528 over first surface 504 of substrate 502 and exposing a top surface 514 of one or more of the conductive pillars 510 at a top exterior surface 532 of molding compound 528. In one embodiment, forming a molding compound 202 includes forming a molding compound 628 over first surface 604 of substrate 602 and exposing a top surface 614 of one or more of the conductive pillars 610 at a top exterior surface 632 of molding compound 628.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A device, comprising:
    a substrate that includes conductive structures and has a first surface that is opposite to a second surface;
    conductive pillars attached to and electrically coupled with at least one of the conductive structures;
    an integrated circuit disposed over the first surface and electrically coupled with one or more of the conductive structures, wherein one of the conductive structures is embedded in the substrate and includes a first surface that is opposite to a second surface, wherein the first surface of the embedded conductive structure is exposed at and substantially parallel with the first surface of the substrate, wherein the second surface is exposed at and substantially parallel with the second surface of the substrate, and wherein the integrated circuit is mounted on and in thermal contact with the first surface of the embedded conductive structure; and
    a molding compound over the first surface of the substrate.

2. The device of claim 1, wherein one or more of the conductive pillars are adjacent to one or more edges of the first surface of the substrate and configured to form an interlocking relationship between the molding compound and the substrate.

3. The device of claim 1, wherein one or more of the conductive pillars are adjacent to one or more edges of the first surface of the substrate, and wherein a portion of each one of the one or more of the conductive pillars is exposed at a side exterior surface of the molding compound.

4. The device of claim 3, further comprising a metal electromagnetic interference shield over at least a portion of the exterior surface of the molding compound, wherein the metal electromagnetic interference shield is in conductive contact with the portion of the one or more of the conductive pillars.

5. The device of claim 3, further comprising a metal antenna over at least a portion of the exterior surface of the molding compound, wherein the metal antenna is in conductive contact with the portion of the one or more of the conductive pillars.

6. The device of claim 1, wherein one or more of the conductive pillars are adjacent to one or more edges of the first surface of the substrate, and wherein a top surface of each one of the one or more of the conductive pillars is exposed at a top exterior surface of the molding compound.

7. The device of claim 1, wherein another one of the conductive structures is embedded in the substrate and includes a first surface that is exposed at the first surface of the substrate and a second surface that is exposed at and substantially parallel with the second surface of the substrate, wherein one of the conductive pillars is attached to and electrically coupled with the first surface of the another one of the conductive structures and includes a top surface that is exposed at a top exterior surface of the molding compound.

8. The device of claim 1, wherein the integrated circuit is mounted on and electrically coupled to three or more of the conductive pillars.

* * * * *